(12) United States Patent
Kato

(10) Patent No.: US 6,803,632 B2
(45) Date of Patent: Oct. 12, 2004

(54) SEMICONDUCTOR CIRCUIT HAVING AN INPUT PROTECTION CIRCUIT

(75) Inventor: Katsuhiro Kato, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 10/601,879

(22) Filed: Jun. 24, 2003

(65) Prior Publication Data

US 2004/0135206 A1 Jul. 15, 2004

(30) Foreign Application Priority Data

Jan. 15, 2003 (JP) ........................................ 2003/006965

(51) Int. Cl.[7] .............................................. H01L 23/62
(52) U.S. Cl. ...................... 257/357; 257/358; 257/360; 257/361
(58) Field of Search ............................... 257/357, 358, 257/359, 360, 361, 362, 363

(56) References Cited

U.S. PATENT DOCUMENTS 5,021,853 A   6/1991   Mistry
5,508,548 A * 4/1996   Tailliet ........................ 257/360
5,654,571 A * 8/1997   Tsuji .......................... 257/357
6,624,479 B2 * 9/2003  Sawahata .................... 257/355
2003/0116806 A1 * 6/2003 Kato ......................... 257/357

FOREIGN PATENT DOCUMENTS

JP          09-023005         1/1997

* cited by examiner

Primary Examiner—Ngân V. Ngô
(74) Attorney, Agent, or Firm—Rabin & Berdo, P.C.

(57) ABSTRACT

A semiconductor circuit has an output circuit, an input circuit and an input protection circuit. The output circuit is connected to a first power supplying terminal and a reference terminal for outputting an output signal. The output circuit has first transistors serially connected between the first terminal and the reference terminal. The input circuit is connected to a second power supplying terminal and the reference terminal. The input circuit has second transistors serially connected between the second terminal and the reference terminal. Each of the first and second transistors has a gate, a source and a drain. In the source and drain, there is a first low resistance region around a contact formed thereon so that a high resistance region is located between the gate and the first low resistance region.

20 Claims, 6 Drawing Sheets

SEMICONDUCTOR CIRCUIT HAVING AN INPUT PROTECTION CIRCUIT

BACKGROUND OF THE INVENTION

The present invention relates to a semiconductor device such as a level shifter circuit or the like, which has a plurality of power supply systems and includes circuits having a configuration wherein a signal outputted from the circuit which belongs to one power supply system is received as a signal inputted to each of the circuits which belong to different power supply systems, and specifically to a semiconductor device using transistors as circuit constituent transistors, each of which adopts a so-called salicide structure wherein a compound layer (hereinafter described as salicide layer) of silicon and a metal is formed on the surface of an impurity diffusion layer to reduce a parasitic resistance of the impurity diffusion layer.

A semiconductor device having a plurality of power supply systems has been in the mainstream in recent years. For instance, a driver LSI (Large Scale Integrated Circuit) for driving various display units has such a configuration that a control system is driven by a low voltage (e.g., 3V) to reduce power consumption, and a high voltage of a few 10V is supplied as a voltage to be outputted to the corresponding display unit to thereby protect display quality (contrast). Even a semiconductor device generally called a system LSI takes such a configuration that a logical circuit is driven by a low voltage (e.g., 3V) and a necessary voltage (e.g., 5V) can be supplied to a semiconductor device to be controlled as an output voltage. This type of semiconductor device has a plurality of power supply systems and includes circuits having such a configuration that a signal outputted from the circuit that belongs to one power supply system is received as a signal to be inputted to each of the circuits that belong to the different power supply systems.

Such a semiconductor device (for example, a semiconductor device such as a level shifter circuit or the like, including circuits having such a configuration that a signal outputted from the circuit that belongs to one power supply system is received as a signal inputted to each of the circuits that belong to different power supply systems) having the plurality of power supply systems is also normally provided with a protection circuit to protect operation circuits from electrostatic discharge (ESD) or the like.

As a protection transistor constituting the present protection circuit, a transistor having a structure, a so-called salicide structure, wherein a clock frequency of a device is made fast and a salicide layer is formed on a source/drain so as to suppress a parasitic resistance as low as possible has been in the mainstream in recent years. However, a problem arises in that the transistor having such a salicide structure is low in resistance and easily destructed or damaged by an electrostatic surge. With a view toward to increasing the resistance of the protection transistor to avoid its easy damage due to the electrostatic surge, a method of fabricating a transistor having such a structure that a silicide layer low in resistance is not formed selectively, as a transistor constituting a protection circuit, has therefore been disclosed in, for example, U.S. Pat. No. 5,021,853. Further, a transistor such a configuration that a high-resistance $Ti_xN_ySi$ layer (mixing layer) is provided, has been disclosed in Japanese Patent Publication No. Hei 9(1997)-023005.

However, the use of the protection circuit comprised of the protection transistor increased in resistance means that an electrostatic surge voltage entered through a source or power supply becomes apt to be transferred to each operation circuit, whereas an electrostatic surge becomes hard to be transferred to the protection circuit. This shows that the protection circuit which has heretofore been effective, has no practical applicability.

SUMMARY OF THE INVENTION

The present invention may provide a semiconductor device having power supply systems, which prevents electrostatic surge-based breakdown or damage of a gate oxide film for each interface transistor of circuits having such a configuration that a signal outputted from the circuit that belongs to one power supply system is received as a signal to be inputted to each of the circuits that belong to different power supply systems.

According to the present invention, there is provided a semiconductor circuit has an output circuit, an input circuit and an input protection circuit. The output circuit is connected to a first power supplying terminal and a reference terminal for outputting an output signal. The output circuit has first transistors serially connected between the first terminal and the reference terminal. The input circuit is connected to a second power supplying terminal and the reference terminal. The input circuit has second transistors serially connected between the second terminal and the reference terminal. Each of the first and second transistors has a gate, a source and a drain. In the source and drain, there is a first low resistance region around a contact formed thereon so that a high resistance region is located between the gate and the first low resistance region.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Preferred embodiments of the present invention will hereinafter be described with reference to the accompanying drawings. Incidentally, components having substantially similar functions are respectively identified by the same reference numerals through all the drawings, and their description might be omitted in some cases.

Figure 1:
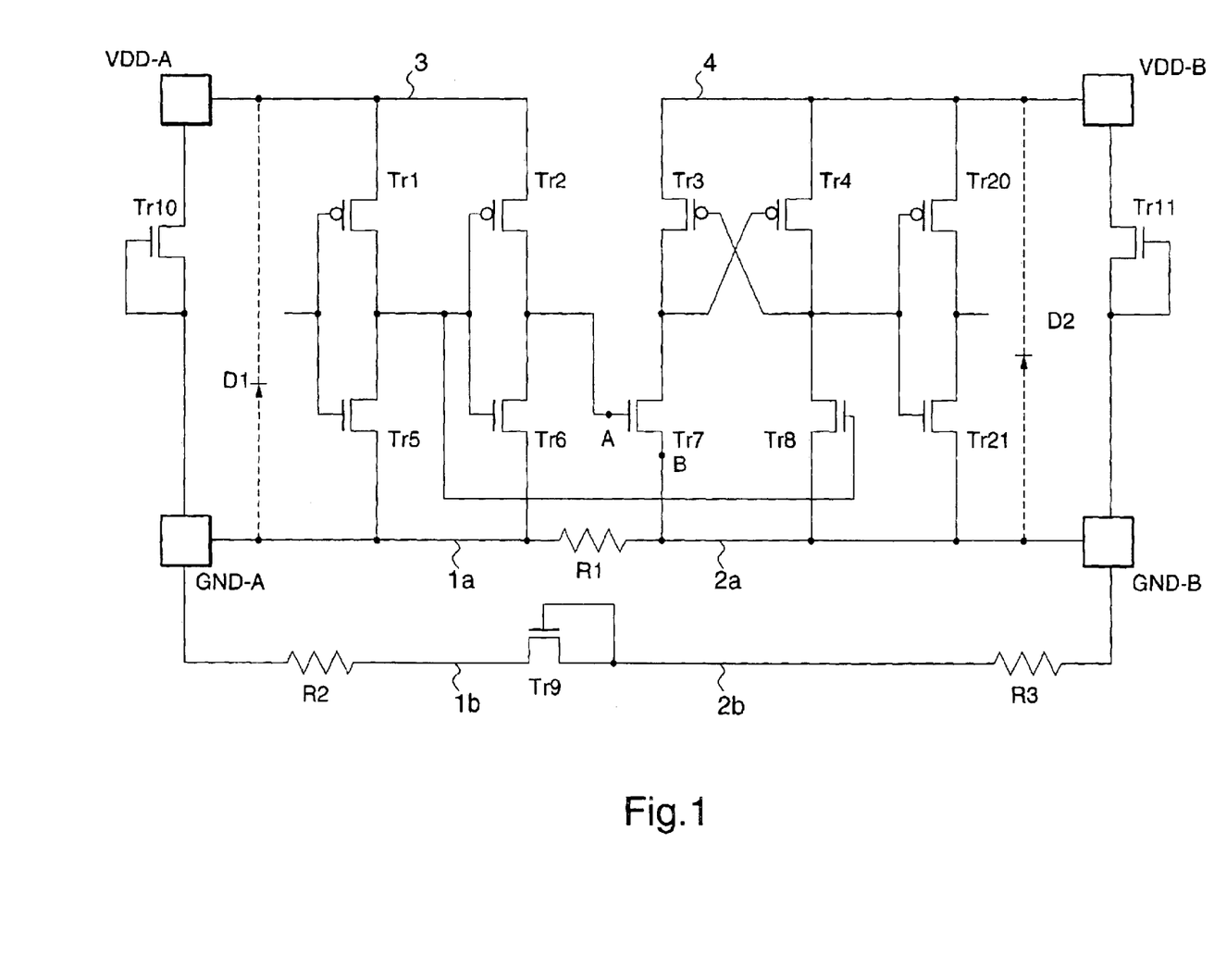
FIG. 1 is a circuit diagram showing a level shifter circuit which constitutes a semiconductor device according to a first embodiment.
Figure 2:
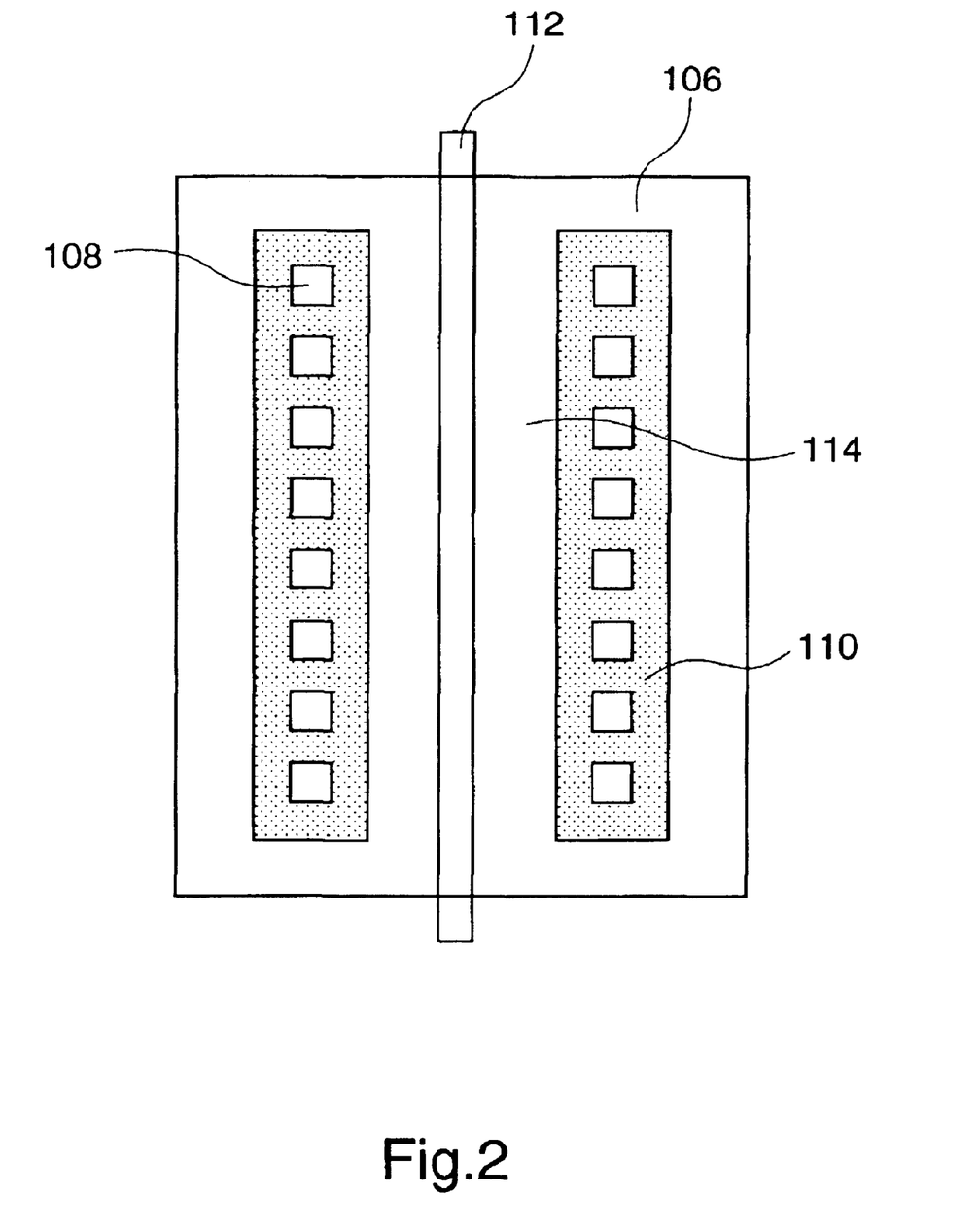
FIG. 2 is a plan view illustrating a transistor employed in the level shifter circuit shown in FIG. 1.
Figure 3:
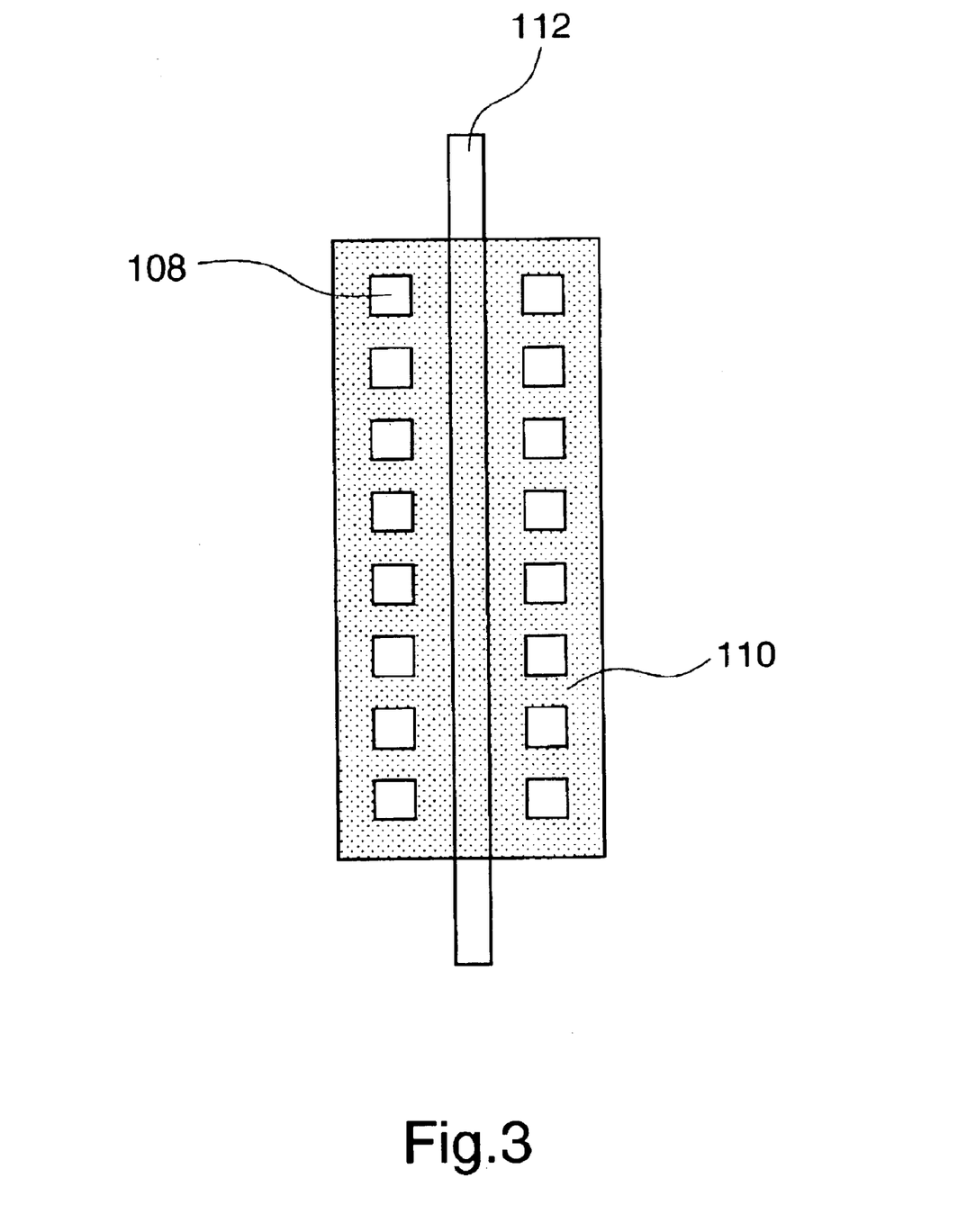
FIG. 3 is a plan view showing another transistor employed in the level shifter circuit shown in FIG. 1.

FIG. 1 is a circuit diagram showing a level shifter circuit which constitutes a semiconductor device according to a first embodiment. FIG. 2 is a plan view illustrating a transistor used in the level shifter circuit which constitutes the semiconductor device according to the first embodiment. FIG. 3 is a plan view depicting another transistor used in the level shifter circuit of the semiconductor device according to the first embodiment.

The present embodiment illustrates the level shifter circuit as shown in FIG. 1. The level shifter circuit includes an output circuit (first circuit) which belongs to a power supply VDD-A, an input circuit (second circuit) which belongs to a power supply VDD-B, and a protection circuit, and has a configuration wherein a signal outputted from the output circuit which belongs to the power supply VDD-A, is received as a signal inputted to the input circuit which belongs to the power supply VDD-B.

In the output circuit, a P channel MOS (Metal-Oxide-Semiconductor, which is hereinafter called "PMOS") transistor Tr1 (first transistor) and an N channel MOS (Metal-Oxide-Semiconductor, which is hereinafter called "NMOS") transistor Tr5 (first transistor) both connected in series, and a PMOS transistor Tr2 (first transistor) and an NMOS transistor Tr6 (first transistor) both connected in series are connected in parallel between a source line 3 and a ground line 1a. The drain of the PMOS transistor Tr1 and the drain of the NMOS transistor Tr5 are short-circuited and connected to the gates of the PMOS transistor Tr2 and NMOS transistor Tr6 and the gate of an NMOS transistor Tr8 which constitutes the input circuit. On the other hand, the drain of the PMOS transistor Tr2 and the drain of the NMOS transistor Tr6 are short-circuited and connected to the gate of an NMOS transistor Tr7 which constitutes the input circuit.

In the input circuit, a PMOS transistor Tr3 and the NMOS transistor Tr7 connected in series, a PMOS transistor Tr4 and the NMOS transistor Tr8 connected in series, and a PMOS transistor Tr20 and an NMOS transistor Tr21 connected in series are parallel-connected between a source line 4 and a ground line 2a. The drain of the PMOS transistor Tr4 and the drain of the NMOS transistor Tr8 are short-circuited and connected to the gate of the PMOS transistor Tr3 and the gates of the PMOS transistor Tr20 and NMOS transistor Tr21. The drain of the PMOS transistor Tr3 and the drain of the NMOS transistor Tr7 are short-circuited and connected to the gate of the PMOS transistor Tr4.

The protection circuit comprises a PN junction diode D1 parasitically formed between a P type substrate and an N-type well and connected between the source line 3 and the ground line 1a, a PN junction diode D2 parasitically formed between the P-type substrate and the N-type well and connected between the source line 4 and the ground line 2a of the input circuit, and a substrate resistor R1. Further, the protection circuit comprises a wiring resistor R2, a protection transistor Tr9 and a wiring resistor R3 connected between a ground terminal GND-A and a ground terminal GND-B, a protection transistor Tr10 connected between the power supply VDD-A and the ground terminal GND-A, and a protection transistor Tr11 connected between the power supply VDD-B and the ground terminal GND-B.

If the PN junction diode D1 is large in capacitance and the substrate resistor R1 is low where an electrostatic surge is normally applied between the power supply VDD-A and the ground terminal GND-B in such a level shifter circuit, then the electrostatic surface flowing out of the power supply VDD-A reaches the ground terminal GND-B via the PN junction diode D1 and the substrate resistor R1, where it disappears. However, the protection circuit made up of the PN junction diode D1 and the substrate resistor R1 has a problem in that its protection performance varies greatly for each product and hence a stable protection effect cannot be expected. Although the protection circuit effectively transfers the electrostatic surge from the power supply VDD-A to the ground terminal GND-B, the PN junction diode D1 depends on the scale of an internal circuit and the substrate resistor R1 is susceptible to its layout. Therefore, the protection performance varies for each product under the current circumstances.

Therefore, when the PN junction diode D1 is low in capacitance and the substrate resistor R1 is high (i.e., when the protection circuit does not function sufficiently), the electrostatic surge voltage entered through the power supply VDD-A is transferred to the gate (point A) of the transistor Tr7 through the transistor Tr2. Thus, when the difference in potential between the point A and a point B connected to the ground terminal GND-B exceeds an insulation withstand voltage of a gate oxide film for the transistor Tr7, the gate oxide film for the transistor Tr7 will be damaged. Since the same circuit configuration is taken, a gate oxide film for the transistor Tr8 might be damaged through the transistor Tr1. In the case in which the electrostatic surge is applied between the ground terminal GND-A and the power supply VDD-B, the surge voltage is applied to the gate of the transistor Tr7 (or transistor Tr8) through the transistor Tr6 (or transistor Tr5) constituting the output circuit and the transistor Tr3 (or transistor Tr4) constituting the input circuit. Therefore, a problem arises in that the gate oxide film is apt to be damaged.

On the other hand, even when the protection circuit does not function sufficiently, the electrostatic surge entered through the power supply VDD-A temporarily reaches the ground terminal GND-A through the protection transistor Tr10. Thereafter, the electrostatic surge reaches the ground terminal GND-B through the protection transistor Tr9, where it disappears. At this time, the protection transistor Tr9 placed in the protection circuit is generally provided between ground lines 1b and 2b for connecting between the ground terminal GND-A and the ground terminal GND-B, which are different from the ground lines 1a and 2a directly connected with the corresponding level shifter. This is provided to protect a group of level shifters disposed in countless numbers on a chip for the semiconductor device by means of one or several protection transistors Tr9. The protection transistor Tr9 is generally placed in the neighborhood of a pad for the ground terminal GND-A or a pad for the ground terminal GND-B. Therefore, it takes time to cause a surge current to reach from the ground terminal GND-A to the ground terminal GND-B via the protection transistor Tr9 in regard to the level shifter placed in a position where the wiring resistor R2 or R3 becomes large. A problem remains in that the breakdown or damage of the gate oxide films for the transistor Tr7 and the protection transistor Tr8 occurs during this period.

Further, in order to prevent the protection transistor Tr9 and the protection transistors Tr10 and Tr11 from being easily damaged by the electrostatic surge as described above, the protection transistors Tr9, Tr10 and Tr11 are configured as transistors having a configuration (where the protection transistor Tr9 may take a configuration wherein a salicide layer is formed over the entire surface shown in FIG. 2), i.e., a salicide layer part forming structure, in which, as shown in FIG. 2, salicide layers 110 are formed in the neighborhood of contact holes 108 defined in an impurity diffusion layer 106 used as a source and drain, and salicide layer non-forming areas 114 (held in the as-is state of a P-type or N-type impurity diffusion layer) unformed with the salicide layers 110 are provided between a gate 112 and the contact holes 108. In doing so, the electrostatic surge becomes hard to be transferred via the protection transistor Tr10 and the protection transistor Tr9. Further, the electrostatic surge becomes apt to be transferred to the gate (point A) of the transistor Tr7, and hence the gate oxide film for each transistor constituting an operation circuit becomes apt to be damaged.

Thus, in the present embodiment, the PMOS transistors Tr1 and Tr2 and NMOS transistors Tr5 and Tr6 constituting the output circuit, and the PMOS transistors Tr3 and Tr4 and NMOS transistors Tr7 and Tr8 constituting the input circuit are also configured in such a manner that as shown in FIG. 2, the salicide layers 110 are formed in the neighborhood of the contact holes 108 defined in the impurity diffusion layer 106 used as the source and drain, and the salicide layer non-forming areas 114 (which remain the P-type or N-type impurity diffusion layer) formed with no salicide layers 110 are provided between the gate 112 and the contact holes 108.

On the other hand, as shown in FIG. 3, the transistors Tr20 and Tr21 constituting the input circuit take a configuration wherein a salicide layer 110 is formed over the whole surface between a gate 112 and contact holes 108 at an impurity diffusion layer (not shown in FIG. 2) used as a source and drain.

Thus, when the salicide layer is formed over the whole surface between the gate and the contact holes at the impurity diffusion layer used as the source and drain, a surge current suddenly flows in the transistor so that the transistor becomes apt to be destroyed or damaged. On the other hand, when the area (salicide layer non-forming area) in which the impurity diffusion layer remains as is, is provided between the gate and the contact holes, the salicide layer is formed only around the contact holes connected with metal wirings to achieve a reduction in resistance, thereby making it possible to suitably restrict a surge current. Therefore, electrostatic discharge withstand of the transistor per se is enhanced.

Therefore, when, for example, the electrostatic surge entered through the power supply VDD-A is propagated to the NMOS transistor Tr7 or Tr8 of the input circuit through the transistor Tr2 or Tr1 constituting the output circuit by way of its corresponding signal line, the salicide layer non-forming area is brought to a high resistance because the salicide layer on the sources and drains of the PMOS transistors Tr2 and Tr1 has been removed, so that the surge voltage becomes hard to be transferred to the gate of the NMOS transistor Tr7 or Tr8. On the other hand, since the salicide layer on the sources and drains of the NMOS transistors Tr7 and Tr8 of the input circuit have been removed, the salicide layer non-forming area is brought to a high resistance, so that the application of the surge voltage between the gates and sources or gates and drains of the NMOS transistors Tr7 and Tr8 is relaxed.

When, for example, the electrostatic surge entered through the ground terminal GND-A is also propagated to the NMOS transistor Tr7 or NMOS transistor Tr8 on the input circuit side through the NMOS transistor Tr5 or NMOS transistor Tr6 by way of its corresponding signal line, the salicide layer non-forming area is brought to a high resistance because the salicide layer on the sources and drains of the NMOS transistors Tr5 and NMOS transistor Tr6 has been removed, so that the surge voltage becomes hard to be transferred to the gate of the NMOS transistor Tr7 or NMOS transistor Tr8.

Further, since the salicide layer on the sources and drains of the PMOS transistors Tr3 and Tr4 taken up along a route that exits from the ground terminal GND-A to the power supply VDD-B, for example, has been removed, the surge voltage becomes hard to escape or drop out, so that the application of the surge voltage between the gates and sources of the NMOS transistors Tr7 and Tr8 or the gates and drains thereof is relaxed.

Thus, in the present embodiment, the PMOS transistors Tr1 and Tr2 and NMOS transistors Tr5 and Tr6 on the output circuit side, and the PMOS transistors Tr3 and Tr4 and NMOS transistors Tr7 and Tr8 on the input circuit side take such a configuration that the salicide layers 110 are formed on the impurity diffusion layer 106 used as the source and drain over the peripheries of the impurity diffusion layer 106 and contact holes 108, and the salicide layer non-forming areas 114 are formed between the contact holes 108 and the gate 112. Therefore, the electrostatic surge becomes hard to propagate to the NMOS transistor Tr7 or Tr8 on the input circuit side so that the gate oxide film for the NMOS transistor Tr7 or Tr8 can be prevented from being damaged.

In the present embodiment, the surge current can be fed from the power supply VDD-A to the ground terminal GDN-B via the protection transistor Tr10 and the protection transistor Tr9 in advance of the attainment of the difference in potential between the gate and source of the NMOS transistor Tr7 or Tr8 on the input circuit side to the insulation breakdown voltage of the gate oxide film. Hence the gate oxide film for the NMOS transistor Tr7 or Tr8 can be more reliably prevented from breaking down. Since the electrostatic surge can be supplied via the protection transistor Tr9 and protection transistor Tr11 even in the case in which the electrostatic surge exists from the ground terminal GND-A to the power supply VDD-B, the gate oxide film for the NMOS transistor Tr7 or Tr8 can be prevented from being damaged.

This results from the following. Since any of the protection transistors Tr9, Tr10 and Tr11 that need to quickly transfer the electrostatic surge, and the transistors Tr1 through Tr8 through which it is preferably hard to transfer the electrostatic surge, is set to such a structure that the salicide layer is partly removed, ease of flowing of the electrostatic surge current is proportional to the width of the gate of each transistor if the same structure is adopted. Therefore, the gate widths of the transistors Tr1 through Tr8 through which it is preferable not to carry or feed the electrostatic surge current, can respectively be set to a minimum value necessary for a circuit operation. Further, the gate widths of the transistors Tr9 through Tr11 through which it is preferable to feed the electrostatic surge current, can respectively be set to the optimum value at which the surge current can quickly be fed out before the gate oxide film for the transistors Tr7 and Tr8 intended for protection is damaged.

Since the present embodiment takes such a configuration that the electrostatic surge becomes hard to be transferred to each operation circuit, a resistor (not shown) provided between the output circuit and the input circuit (between the drains of the transistors Tr2 and Tr6 and the gate of the transistor Tr7, which are connected to one another) can be also reduced in resistance value, and hence the semiconductor device can be brought to less size.

Figure 4:
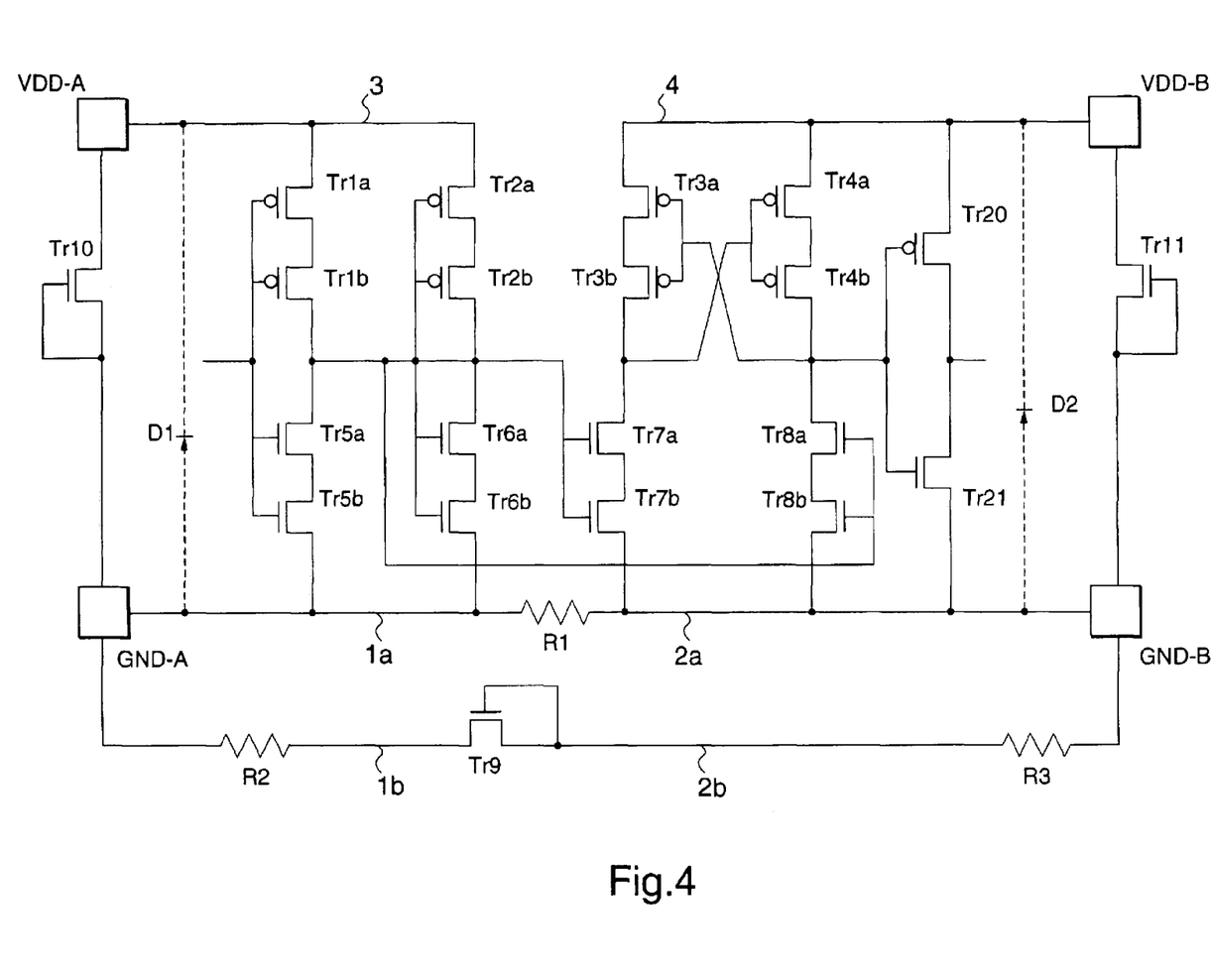
FIG. 4 is a circuit diagram depicting a level shifter circuit which constitutes a semiconductor device according to a second embodiment.

FIG. 4 is a circuit diagram showing a level shifter circuit of a semiconductor device according to a second embodiment of the present invention.

In the present embodiment, the PMOS transistors Tr1 and Tr2 on the output circuit side in the first embodiment are respectively configured in two stages, i.e., they are respectively made up of PMOS transistors Tr1a and Tr1b and PMOS transistors Tr2a and Tr2b connected in series. The NMOS transistors Tr5 and Tr6 on the output circuit side are respectively configured in two stages, i.e., they are respectively made up of NMOS transistors Tr5a and Tr5b and NMOS transistors Tr6a and Tr6b connected in series. The PMOS transistors Tr3 and Tr4 on the input circuit side are respectively configured in two stages, i.e., they are respectively made up of PMOS transistors Tr3a and Tr3b and PMOS transistors Tr4a and Tr4b connected in series. The NMOS transistors Tr7 and Tr8 on the input circuit side are respectively configured in two stages, i.e., they are respectively made up of NMOS transistors Tr7a and Tr7b and NMOS transistors Tr8a and Tr8b connected in series.

Ones of pairs of the transistors comprising the transistors Tr1a and Tr1b, transistors Tr2a and Tr2b, transistors Tr3a and Tr3b, transistors Tr4a and Tr4b, transistors Tr5a and Tr5b, transistors Tr6a and Tr6b, transistors Tr7a and Tr7b, and transistors Tr8a and Tr8b respectively make use of the transistor provided with the salicide layer non-forming areas shown in FIG. 2. The others of the pairs of transistors respectively make use of the transistor formed with the salicide layer over the whole surface shown in FIG. 3. The present embodiment is similar to the first embodiment except for these. Incidentally, both of each pair of transistors may take such a form using the transistor provided with the salicide layer non-forming areas shown in FIG. 2.

Since the number of stages of the transistors on the actual operation circuit (output circuit and input circuit) sides is increased twice in the present embodiment, the present embodiment is brought to such a configuration that an electrostatic surge becomes hard to be transferred more reliably. Gate oxide films for the transistors Tr7a and Tr7b and transistors Tr8a and Tr8b on the output circuit side can be prevented from being damaged.

Therefore, in the present embodiment, the protection transistors Tr9, Tr10 and Tr11 to which the quick transfer of the electrostatic surge is desired, are held in configuration as it is, and the transistors Tr1 through Tr8 through which it is preferably hard to transfer the electrostatic surge, are respectively made up of two-stage transistors to thereby make it harder to cause the surge current to flow therethrough. Therefore, the surge current becomes apt to flow via the protection transistor Tr9 and the protection transistor Tr10 or the protection transistor Tr9 and the protection transistor Tr11, and the gate oxide films for the transistors Tr7a and Tr7b and transistors Tr8a and Tr8b can be more reliably protected.

Figure 5:
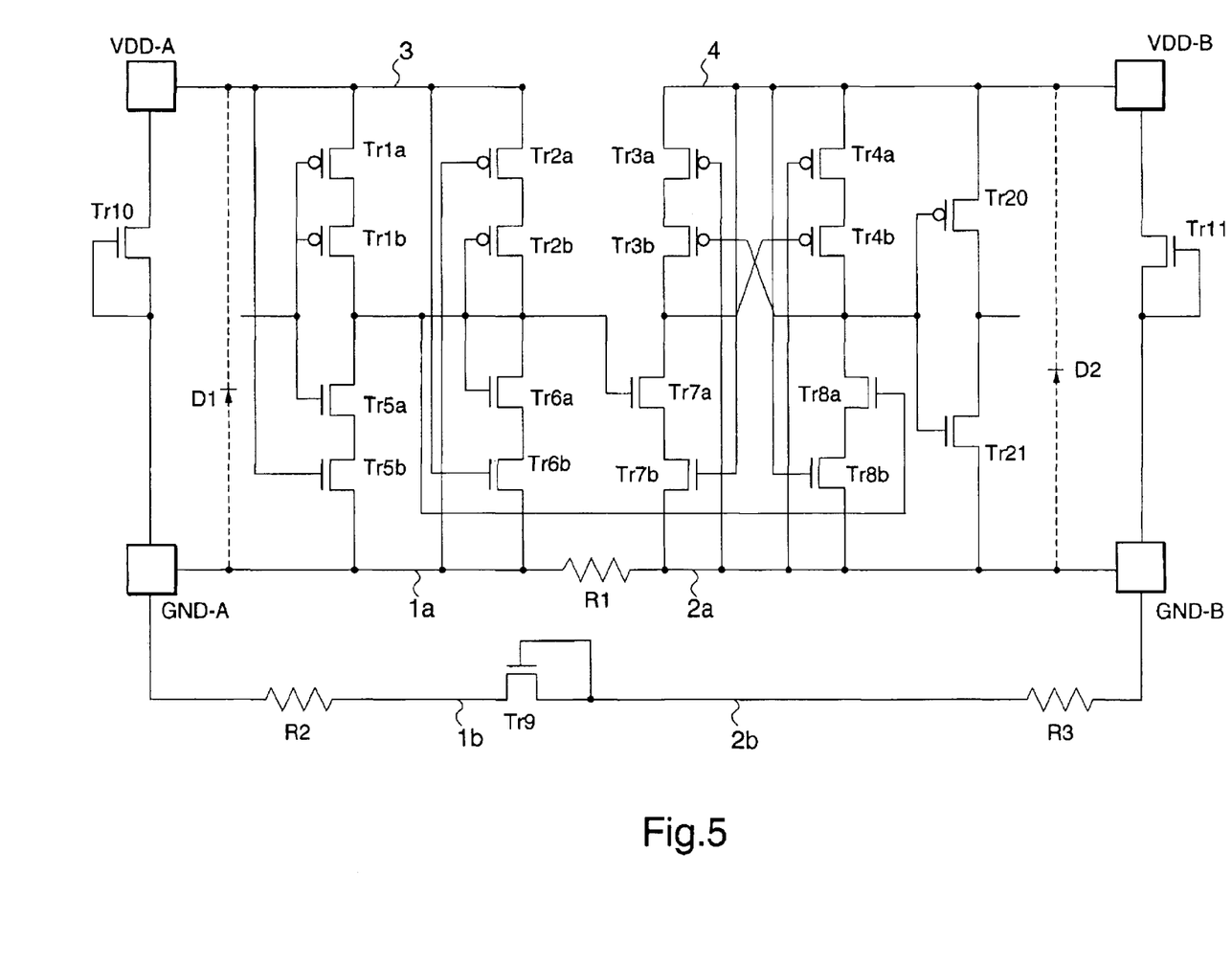
FIG. 5 is a circuit diagram showing a level shifter circuit which constitutes a semiconductor device according to a third embodiment.

FIG. 5 is a circuit diagram showing a level shifter circuit of a semiconductor device according to a third embodiment of the present invention.

The present embodiment takes a configuration wherein the gates of the transistors provided with the salicide layer non-forming areas shown in FIG. 2, of the pairs of PMOS transistors Tr1a and Tr1b, PMOS transistors Tr2a and Tr2b, PMOS transistors Tr3a an Tr3b, PMOS transistors Tr4a and Tr4b, NMOS transistors Tr5a and Tr5b, NMOS transistors Tr6a and Tr6b, NMOS transistors Tr7a and Tr7b, and NMOS transistors Tr8a and Tr8b employed in the second embodiment are respectively connected to source lines 3 and 4 or ground lines 1a and 2a so as to reach such a potential as to allow a normally on state. The present embodiment is similar to the second embodiment except for it.

In the present embodiment, the gates of the transistors provided with the salicide layer non-forming areas shown in FIG. 2, of the pairs of transistors connected to the same nodes in the second embodiment are connected to such a potential as to allow the normally on state. Therefore, a driving force on the output circuit side can be reduced, i.e., the gate width of each of the output transistors (transistors Tr1b, Trb2, Tr5a and Tr6a) can be reduced. On the input circuit side, the gate widths of the NMSO transistors being in danger of the occurrence of breakdown of a gate oxide film can be reduced as compared with the second embodiment. This is because the NMOS transistors Tr7a and Tr7b and NMOS transistors Tr8a and Tr8b are all configured so as to receive the signal on the output circuit side in the second embodiment, i.e., all these transistors are objects that develop the damage of the gate oxide films, whereas since the gates of the transistors Tr7b and Tr8b are changed to such connections as to reach the normally on state in the present embodiment, these transistors do not give rise to the breakdown of the gate oxide film, and only the remaining transistors Tr7a and Tr8a are of such objects as to produce breakdown or damage of the gate oxide film, whereby the risk of occurrence of damage of the gate oxide film is reduced.

Since only ones of the pairs of transistors may be driven as to the PMOS transistors Tr3a and Tr3b and the PMOS transistors Tr4a and Tr4b on the input circuit side, the gate widths of the NMOS output transistors (NMOS transistors Tr7a and Tr8a) can be still further reduced.

In the present embodiment, one of the pair of transistors makes use of the transistor provided with the high-resistance salicide layer non-forming area shown in FIG. 2 and whose gate is normally on-connected, whereas the other thereof whose gate potential is changed to actually perform a circuit operation, makes use of the transistor formed with the low-resistance salicide layer shown in FIG. 3 over the whole surface. Therefore, simulation parameter (Spice/Parameters) necessary upon circuit design can be used as they are. Further, the compatibility between the prevention of damage of the gate oxide films for the transistors Tr7a and Tr7b and transistors Tr8a and Tr8b on the output circuit side, and the speeding up of the circuit operation (speeding up of device's clock frequency) can be realized. Incidentally, it is needless to say that the normally on-connection of one of the pair of transistors does not influence the actual operation.

Figure 6:
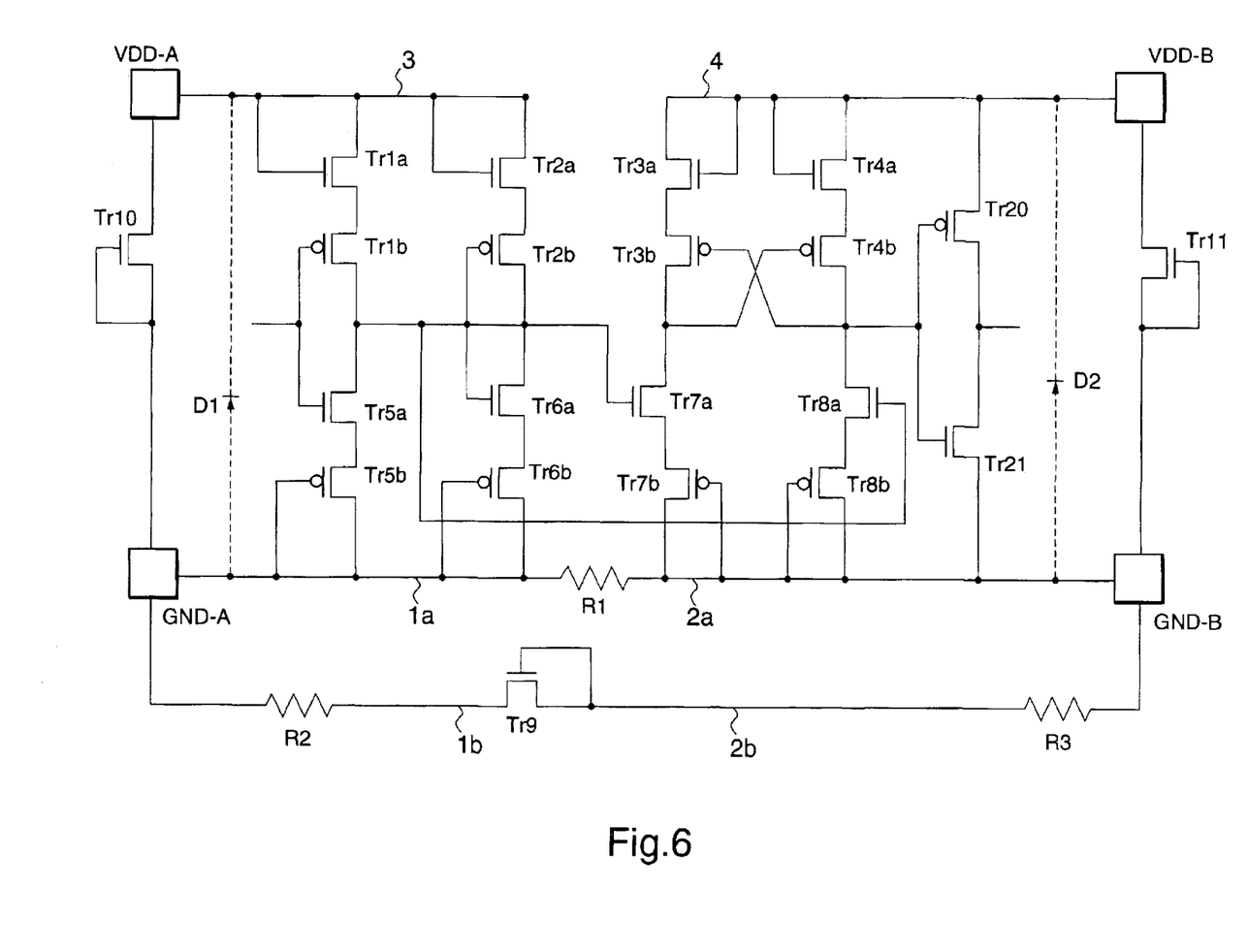
FIG. 6 is a circuit diagram illustrating a level shifter circuit which constitutes a semiconductor device according to a fourth embodiment.

FIG. 6 is a circuit diagram showing a level shifter circuit of a semiconductor device according to a fourth embodiment of the present invention.

In the present embodiment, the pairs of transistors Tr1a and Tr1b, transistors Tr2a and Tr2b, transistors Tr3a and Tr3b, transistors Tr4a and Tr4b, transistors Tr5a and Tr5b, transistors Tr6a and Tr6b, transistors Tr7a and Tr7b and transistors Tr8a and Tr8b are configured in pairs of two types of conductivity type transistors (whose ones are made up of PMOS transistors and whose others are made up of NMOS transistors). One that do not contribute to the circuit operations, i.e., the transistors unallowed to be driven respectively take the configuration wherein the salicide layer non-forming areas shown in FIG. 2 are provided. The gates of the transistors are respectively connected to the source lines 3 and 4 or the ground lines 1a and 2a so as to assume a potential for bringing them to the normally on state. The present embodiment is similar to the third embodiment except for the above.

Since the pairs of transistors are respectively configured in pairs of the PMOS and NMOS transistors in the present embodiment, the NMOS transistor works in the reverse direction with respect to an electrostatic surge of positive polarity, thus making it hard to transfer the electrostatic surge. Since the PMOS transistor works in the reverse direction with respect to an electrostatic surge of negative polarity in reverse, it is possible to make it hard to transfer the electrostatic surge.

Therefore, the effect of reliably making it hard to transfer the electrostatic surge without depending on the surge polarity is obtained. Since the two-stage PMOS transistors Tr1a and Tr1b are both operated in the forward direction when the electrostatic surge of positive polarity is applied thereto, for example in the third embodiment, they have the property of making it easy to transfer the surge voltage to the gate of the transistor Tr7a. Since, however, the transistor Tr1a is made up of the NMOS transistor in the present embodiment, it is operated in the reverse direction with respect to the electrostatic surge of positive polarity to thereby prevent the transfer of a surge voltage to the gate of the transistor Tr7a. Since the transistor Tr1a made up of the NMOS transistor works in the forward direction with respect to the electrostatic surge of negative polarity, it is apt to transfer the surge voltage. Since, however, the transistor Tr1b made up of the PMOS transistor is operated in the reverse direction, the transfer of a surge voltage to the gate of the transistor Tr7a can be prevented. In the present embodiment as described above, the destruction of gate oxide films for the transistors Tr7a and Tr8a can be reliably prevented from the electrostatic surges of both positive/negative polarities.

While the first through fourth embodiments respectively have described the level shifter circuit by way of example, they can be all applied to circuits including interface transistors, in which a plurality of power supply systems exist and a signal outputted from the circuit that belongs to one power supply system is received as a signal to be inputted to each of the circuits that belong to the different power supply systems.

While the first through fourth embodiments respectively have described the example in which the transistor provided with the salicide layer non-forming areas shown in FIG. 2 is used as each of the transistors constituting the output circuit (first circuit) and the input circuit (second circuit) both used as the operation circuits, the transistor provided with the salicide layer non-forming areas shown in FIG. 2 may be used as each of the transistors constituting either one of the output circuit (first circuit) and the input circuit (second circuit).

While the second through fourth embodiments respectively have described the configuration wherein the transistors are provided in two stages (i.e., the configuration in which the two transistors are connected in series), a configuration in which the transistors are set in three or more stages (i.e., a configuration in which three or more transistors are connected in series), may be adopted.

The pairs of transistors employed in the third and fourth embodiments may be configured in such a manner that the drive transistors and the transistors kept in the normally on state are changed in position (upper and lower layouts shown in FIGS. 5 and 6).

The first through fourth embodiments can be carried out in plural combinations.

According to the present invention as described above, there can be provided a semiconductor device having a plurality of power supply systems, which prevents electrostatic surge-based breakdown of the gate oxide film for each interface transistor of the circuits having such a configuration that the signal outputted from the circuit that belongs to one power supply system is received as the signal to be inputted to each of the circuits that belong to the different power supply systems.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. A semiconductor circuit comprising:
   an output circuit connected to a first power supplying terminal and a reference terminal for outputting an output signal, the output circuit having a plurality of first transistors serially connected between the first power supplying terminal and the reference terminal;
   an input circuit connected to a second power supplying terminal and the reference terminal for receiving the output signal, the input circuit having a plurality of second transistors serially connected between the second power supplying terminal and the reference terminal, one of the second transistors having a gate for receiving the output signal; and
   an input protection circuit connected to the output circuit and the input circuit;
   wherein each of the first and second transistors has a gate, a source having a first low resistance region around a first contact formed thereon so that a first high resistance region is located between the gate and the first low resistance region, and a drain having a second low resistance region around a second contact formed thereon so that a second high resistance region is located between the gate and the second low resistance region.

2. A semiconductor circuit according to claim 1, wherein the low resistance region is formed of a compound containing silicon and a metal.

3. A semiconductor circuit according to claim 2, wherein the low resistance region is a salicide layer region.

4. A semiconductor circuit according to claim 1, wherein the high resistance region is formed of a diffusion layer.

5. A semiconductor circuit according to claim 1, wherein the input circuit further has a plurality of third transistors each of which has a gate connected to one of the second transistors and a source and a drain both of which has an entire low resistance region.

6. A semiconductor circuit according to claim 5, wherein the entire low resistance region is formed of a compound containing silicon and a metal.

7. A semiconductor circuit according to claim 6, wherein the entire low resistance region is a salicide layer region.

8. A semiconductor circuit according to claim 1, wherein the first transistors have a PMOS transistor having a gate, a drain and a source connected to the first power supplying terminal, and an NMOS transistor having a gate connected to the gate of the PMOS transistor, a drain connected to the drain of the PMOS transistor and a source connected to the reference terminal.

9. A semiconductor circuit according to claim 1, wherein the first transistors include
   a first PMOS transistor having a gate, a drain and a source connected to the first power supplying terminal,
   a second PMOS transistor having a gate connected to the gate of the first PMOS transistor, a source connected to the drain of the first PMOS transistor and a drain,
   a first NMOS transistor having a gate connected to the gates of the PMOS transistors, a drain connected to the drain of the second PMOS transistor and a source, and a second NMOS transistor having a gate connected to the gates of the PMOS transistors, a drain connected to the source of the first NMOS transistor and a source connected to the reference terminal.

10. A semiconductor circuit according to claim 1, wherein the first transistors include a first PMOS transistor having a gate connected to the reference terminal, a drain and a source connected to the first power supplying terminal, a second PMOS transistor having a gate, a source connected to the drain of the first PMOS transistor and a drain, a first NMOS transistor having a gate connected to the gate of the second PMOS transistor, a drain connected to the drain of the second PMOS transistor and a source, and a second NMOS transistor having a gate connected to the first power supplying terminal, a drain connected to the source of the first NMOS transistor and a source connected to the reference terminal.

11. A semiconductor circuit according to claim 1, wherein the first transistors include a first NMOS transistor having a gate connected to the first power supplying terminal, a source and a drain connected to the first power supplying terminal, a first PMOS transistor having a gate, a source connected to the source of the first NMOS transistor and a drain, a second NMOS transistor having a gate connected to the gate of the first PMOS transistor, a drain connected to the drain of the first PMOS transistor and a source, and a second PMOS transistor having a gate connected to the reference terminal, a source connected to the source of the second NMOS transistor and a drain connected to the reference terminal.

12. A semiconductor circuit comprising:

a first circuit operating by an electrical power supplied from a first power supplying terminal and a reference terminal, the first circuit outputting an output signal and having a plurality of first transistors serially connected between the first power supplying terminal and the reference terminal;

a second circuit operating by an electrical power supplied from a second power supplying terminal and the reference terminal, the second circuit receiving the output signal and having a plurality of second transistors serially connected between the second power supplying terminal and the reference terminal, one of the second transistors having a gate receiving the output signal; and an input protection circuit connected to the first and second circuits;

wherein each of the first and second transistors has a gate, a source having a first low resistance region around a first contact formed thereon so that a first high resistance region is located between the gate and the first low resistance region, and a drain having a second low resistance region around a second contact formed thereon so that a second high resistance region is located between the gate and the second low resistance region.

13. A semiconductor circuit according to claim 12, wherein the low resistance region is formed of a compound containing silicon and a metal.

14. A semiconductor circuit according to claim 13, wherein the low resistance region is a salicide layer region.

15. A semiconductor circuit according to claim 12, wherein the second circuit further has a plurality of third transistors each of which has a gate connected to one of the second transistors and a source and a drain both of which have an entire low resistance region.

16. A semiconductor circuit according to claim 15, wherein the entire low resistance region is a salicide layer region.

17. A semiconductor circuit comprising:

a first circuit receiving an electrical potential supplied from a first power supplying terminal and a reference terminal, the first circuit generating a signal and having a plurality of first transistors serially connected between the first power supplying terminal and the reference terminal;

a second circuit receiving an electrical potential supplied from a second power supplying terminal and the reference terminal, the second circuit receiving the signal output from the first circuit and having a plurality of second transistors serially connected between the second power supplying terminal and the reference terminal, one of the second transistors having a gate receiving the output signal; and an input protection circuit connected to the first and second circuits;

wherein each of the first and second transistors has a gate, a source having a first low resistance region located around a plurality of first contacts formed thereon and a first high resistance region located between the gate and the first low resistance region, and a drain having a second low resistance region located around a plurality of second contacts formed thereon and a second high resistance region located between the gate and the second low resistance region.

18. A semiconductor circuit according to claim 17, wherein the low resistance region is formed of a compound containing silicon and a metal.

19. A semiconductor circuit according to claim 17, wherein the low resistance region is a salicide layer region.

20. A semiconductor circuit according to claim 17, wherein the second circuit further has a plurality of third transistors each of which has a gate connected to one of the second transistors and a source and a drain both of which have an entire low resistance region.

* * * * *